US012791592B2

(12) United States Patent
Watanabe

(10) Patent No.: US 12,791,592 B2
(45) Date of Patent: Nov. 10, 2026

(54) CURRENT DETECTION DEVICE AND POWER CONVERSION DEVICE FOR POWER DEVICE

(71) Applicant: Hitachi Astemo, Ltd., Hitachinaka (JP)

(72) Inventor: So Watanabe, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 147 days.

(21) Appl. No.: 18/841,263

(22) PCT Filed: Dec. 23, 2022

(86) PCT No.: PCT/JP2022/047682
§ 371 (c)(1),
(2) Date: Aug. 23, 2024

(87) PCT Pub. No.: WO2023/171088
PCT Pub. Date: Sep. 14, 2023

(65) Prior Publication Data

US 2025/0180612 A1 Jun. 5, 2025

(30) Foreign Application Priority Data

Mar. 11, 2022 (JP) ................................ 2022-038256

(51) Int. Cl.
*G01R 19/32* (2006.01)
*H02M 1/00* (2006.01)
*H02M 7/539* (2006.01)

(52) U.S. Cl.
CPC .......... *G01R 19/32* (2013.01); *H02M 1/0009* (2021.05); *H02M 7/539* (2013.01); *H02M 1/0054* (2021.05)

(58) Field of Classification Search
CPC .... G01R 19/32; H02M 1/0009; H02M 7/539; H02M 1/0054; H02M 7/48; H02M 1/00
See application file for complete search history.

(56) References Cited

U.S. PATENT DOCUMENTS

2006/0215341 A1 9/2006 Sakurai et al.
2013/0153900 A1 6/2013 Kinouchi et al.
(Continued)

FOREIGN PATENT DOCUMENTS

JP 2006-271098 A 10/2006
JP 2014-064435 A 4/2014
(Continued)

OTHER PUBLICATIONS

International Search Report Issued in PCT Application No. PCT/JP2022/047682 dated Feb. 7, 2023, with English Translation.

*Primary Examiner* — Alvaro E Fortich
(74) *Attorney, Agent, or Firm* — Foley & Lardner LLP

(57) ABSTRACT

The present invention improves a problem associated with the acquisition of loss data and accurately estimates, from a sense current, main current flowing through a power device. This power device current detection device is characterized in that a circuit for detecting the current of a power device mounted with a power semiconductor having a main element, a current detection sense element, and a temperature detection temperature-sensitive element comprises: a sense element temperature estimation unit for estimating, on the basis of the output of the temperature-sensitive element, a sense element temperature that is the temperature of the sense element; a reference temperature acquiring unit for acquiring the reference temperature of the power device; a main element temperature estimation unit for estimating, on the basis of the sense element temperature and the reference temperature, a main element temperature that is the temperature of the main element; and a main current estimation unit for estimating, on the basis of a sense current value detected by the sense element, the sense element temperature, and the main element temperature, a main current value flowing through the main element. The main element temperature estimation unit uses a thermal impedance ratio that (Continued)

is the ratio between the mutual thermal impedance of the sense element with respect to the heat generation of the main element and the self-thermal impedance of the main element to estimate the main element temperature.

10 Claims, 11 Drawing Sheets

(56) References Cited

U.S. PATENT DOCUMENTS

| | | | | |
|---|---|---|---|---|
| 2013/0257517 | A1* | 10/2013 | Kawashima | G01R 19/32<br>327/513 |
| 2014/0361721 | A1* | 12/2014 | Yamaguchi | H02P 29/68<br>318/472 |
| 2018/0138803 | A1* | 5/2018 | Iyasu | H02M 3/33592 |
| 2022/0069696 | A1* | 3/2022 | Takegami | H02M 1/007 |
| 2022/0221494 | A1* | 7/2022 | Lee | H02M 7/5395 |
| 2022/0321029 | A1 | 10/2022 | Yano et al. | |
| 2023/0060086 | A1 | 2/2023 | Yano et al. | |

FOREIGN PATENT DOCUMENTS

| | | | |
|---|---|---|---|
| JP | 2021-035232 | A | 3/2021 |
| JP | 2021-097435 | A | 6/2021 |
| WO | WO-2012/029652 | A1 | 3/2012 |
| WO | WO-2013/005520 | A1 | 1/2013 |

* cited by examiner

CURRENT DETECTION DEVICE AND POWER CONVERSION DEVICE FOR POWER DEVICE

TECHNICAL FIELD

The present invention relates to a current detection device and a power conversion device for a power device.

BACKGROUND ART

Against the background of the realization of a decarbonized society and countermeasures against air pollution caused by exhaust gas, efforts for the electrification of automobiles have attracted attention. As a motor used for rotating a drive wheel in an electric vehicle or a hybrid vehicle, an interior permanent magnet synchronous motor having a permanent magnet embedded in a rotor is used because of its small size and high torque. Vehicles are required to finely control torque with high efficiency from the viewpoint of ride comfort and quietness in the vehicle interior. For this reason, vector control is generally used as a motor control method for such control.

In the vector control, a current command is calculated from a torque command and a speed generated by an accelerator command or a brake command, and a PWM signal is generated based on the current command to drive a power device of an inverter. At this time, the PWM signal is calculated using an inverter output current measurement value, and control is performed such that the actual current follows the command value. Therefore, a current sensor for measuring an inverter output current is required.

As a frequently used measurement method, there is a method of installing a Hall element type current sensor at an inverter output unit, converting a magnetic field generated by a current into a voltage, and detecting the voltage.

There is another measurement method in which a sense element dedicated to current detection is provided on the same chip of a power semiconductor element such as an IGBT or a MOSFET constituting a power device, and a current (sense current) flowing through the sense element is detected to estimate a current (main current hereinafter) flowing through the power semiconductor element (the main element hereinafter). Such a power conversion circuit is disclosed in, for example, PTL 1. PTL 1 discloses a method of estimating a current with high accuracy by correcting a deviation of a sense ratio due to the temperature difference between a main element and a sense element in consideration of temperature non-uniformity in a chip due to self heating of a power semiconductor element caused by energization.

PTL 2 discloses a method of using the temperature characteristics of the body resistance of a power semiconductor as a temperature sensitive element.

CITATION LIST

Patent Literatures

PTL 1: JP 2021-97435 A
PTL 2: JP 2021-35232 A

SUMMARY OF INVENTION

Technical Problem

In PTL 1, in order to estimate a temperature difference ΔT between the main element and the sense element due to heat generation during an operation, a loss Q of the main element, a heat transfer impedance $Z_M$ from a heat source (loss of the main element) to the main element, and a heat transfer impedance $Z_S$ from the heat source to the sense element are acquired in advance and stored in a memory. At this time, the temperature difference ΔT between the main element and the sense element can be calculated from expression (1) in a frequency region s.

[Math 1]

$$\Delta T(s) = (Z_M(s) - Z_S(s)) \cdot Q(s) \quad (1)$$

PTL 1 further describes calculating a sense ratio $M_{real}$ whose deviation is corrected on the basis of the temperature difference ΔT between the main element and the sense element according to expressions (2) and (3) and estimating a main current from a sense current according to expression (4).

[Math 2]

$$M_{real}(T_S) = K \cdot M_0(T_S) \quad (2)$$

[Math 3]

$$K = \frac{R_M(T_S)}{R_M(T_S + \Delta T)} \quad (3)$$

[Math 4]

$$I_{M\_E} = M_{real}(T_S) \cdot I_S \quad (4)$$

In these expressions, ΔT is a temperature difference between the main element temperature $T_M$ and a temperature $T_S$ of the sense element, $M_{real}$ is the sense ratio obtained by correcting a deviation due to the temperature difference ΔT, $M_0$ is the sense ratio measured in advance in an environment of main element temperature $T_M$=temperature $T_S$ of sense element, $I_{M\_E}$ is a main current estimation value, and $I_S$ is a sense current.

However, the method in PTL 1 has the following two problems regarding the measurement of the loss Q acquired in advance. One is the deterioration of main current estimation accuracy due to a loss measurement error. In particular, the measurement of the switching loss generated at the time of switching is easily affected by individual differences of current and the voltage probe and magnetic noise generated with a change in current and may include a large error. Since the influence of the loss error is reduced in the process of conversion into the main current in expressions (1) to (4), a large estimation error of the main current does not occur (in one example, the main current estimation error with respect to the switching loss measurement error is estimated to be 1% or less). However, since highly accurate torque control is required in a vehicle from the viewpoint of ride comfort, a current error of 1% or less may not be ignored.

The second problem is an increase in the number of development steps for acquiring a loss. Since the loss data varies depending on temperature, voltage, current, gate drive conditions, and the like, it is necessary to widely acquire loss table data under various use conditions assumed in use in a product in advance and store the loss table data in a memory, and the number of steps for evaluation and mounting on a microcomputer increases.

In addition, in a case where it is necessary to change use conditions (for example, a gate drive condition) outside the range of the table data during the development or after commercialization, the number of steps further increases because of the execution of the process of verifying the addition evaluation and implementation of the loss data and the current estimation accuracy. Therefore, it may be difficult to increase the development period and to flexibly change the use conditions.

From the above, an object of the present invention is to provide a current detection device for a power device capable of improving the problem associated with the loss data acquisition and accurately estimating a main current flowing through the power device from a sense current.

Solution to Problem

As described above, in the present invention, "A current detection device is a current detection circuit for a power device on which a power semiconductor including a main element, a sense element for current detection, and a temperature sensitive element for temperature detection is mounted and is characterized by including a sense element temperature estimation unit that estimates a sense element temperature, which is a temperature of the sense element, based on an output of the temperature sensitive element, a reference temperature acquisition unit that acquires a reference temperature of the power device, a main element temperature estimation unit that estimates a main element temperature, which is a temperature of the main element, based on the sense element temperature and the reference temperature, and a main current estimation unit that estimates a main current value flowing through the main element based on the sense current value detected by the sense element, the sense element temperature, and the main element temperature, in which the main element temperature estimation unit estimates the main element temperature by using a thermal impedance ratio, which is a ratio between a mutual thermal impedance of the sense element and a self-thermal impedance of the main element with respect to heat generation of the main element".

In addition, the present invention is "A power conversion device characterized by including a power device on which a power semiconductor including a main element, a sense element for current detection, and a temperature sensitive element for temperature detection is mounted and a control circuit that drives a gate of the power device, in which the control circuit generates a gate signal of the power device according to a main current estimation value estimated by the current detection device for the power device and drives the gate of the power device".

Advantageous Effects of Invention

According to the present invention, a main current flowing through the power device can be accurately estimated from a sense current.

Furthermore, according to the embodiments of the present invention, it is possible to reduce the number of product development steps for loss data acquisition, shorten the development period, and flexibly change the design in accordance with use conditions. Hereinafter, the principle and effect of the invention will be described in detail in the description of the embodiments.

DESCRIPTION OF EMBODIMENTS

Hereinafter, embodiments of the present invention will be described with reference to the accompanying drawings.

Before description of the embodiments, an application example of a power conversion device suitable for applying the present invention and a configuration example of the power conversion device will be described with reference to the accompanying drawings.

The power semiconductor current detection device according to the present invention can be applied to a general power conversion device but is typically applicable to a hybrid vehicle or an electric vehicle in recent years. Accordingly, a case where the current detection device is applied to a hybrid vehicle will be described below as an example. However, it is a matter of course that the power conversion device can be used not only for a hybrid vehicle and an electric vehicle but also for the power conversion device of an electric motor used for other industrial equipment.

Figure 12:
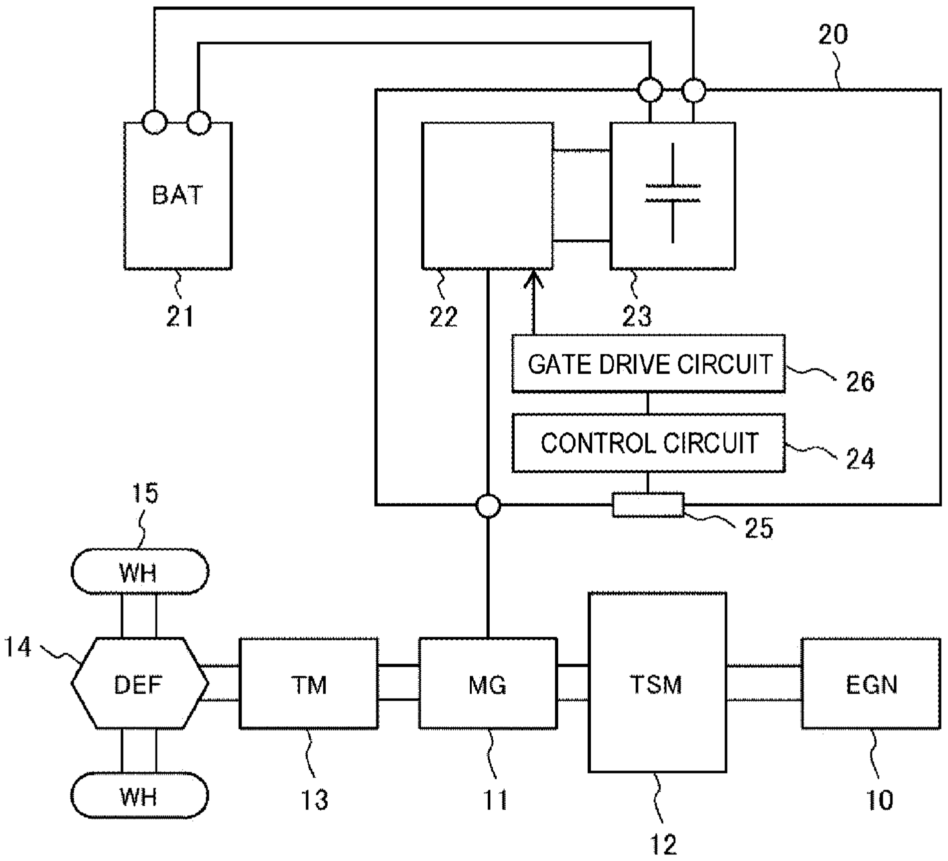
FIG. 12 is a diagram illustrating a system configuration example of a hybrid vehicle.

FIG. 12 illustrates a system configuration example of a hybrid vehicle, and an internal combustion engine 10 and a motor generator 11 are power sources that generate the traveling torque of the vehicle. Further, the motor generator 11 not only generates a rotational torque as an electric motor but also has a power generating function of converting a rotational force which is mechanical energy applied to the motor generator 11 into electric power. In this manner, the motor generator 11 operates as both an electric motor and a generator according to the driving method of the vehicle.

The output of the internal combustion engine 10 is transmitted to the motor generator 11 via a power distribution mechanism 12, and a rotational torque from the power distribution mechanism 12 or the rotational torque generated by the motor generator 11 is transmitted to wheels 15 via a transmission 13 and a differential gear 14.

On the other hand, during the regenerative braking operation, a rotational torque is transmitted from the wheels to the motor generator 11, and the motor generator 11 generates AC power based on the transmitted rotational torque. The generated AC power is converted into DC power by a power conversion device 20 to charge a battery 21 for high voltage, and the charged power is used again as running energy.

The power conversion device 20 includes an inverter circuit 22 and a smoothing capacitor 23. The inverter circuit 22 is electrically connected to the battery 21 via the smoothing capacitor 23, and power is exchanged between the battery 21 and the inverter circuit 22. The smoothing capacitor 23 smooths the DC power supplied to the inverter circuit 22.

A control circuit 24 of the inverter circuit 22 of the power conversion device 20 receives a command from a higher-level control device via a communication connector 25 or transmits data indicating an operation state to the higher-level control device. The control circuit 24 calculates the control amount of the motor generator 11 based on an input command, generates a control signal based on the calculation result, and supplies the control signal to a gate drive circuit 26. Based on this control signal, the gate drive circuit 26 generates a drive signal for controlling the inverter circuit 22.

When the motor generator 11 is operated as an electric motor, the inverter circuit 22 generates AC power based on the DC power supplied from the battery 21 and supplies the AC power to the motor generator 11. The drive mechanism including the motor generator 11 and the inverter circuit 22 operates as an electric/power generation unit.

Figure 13:
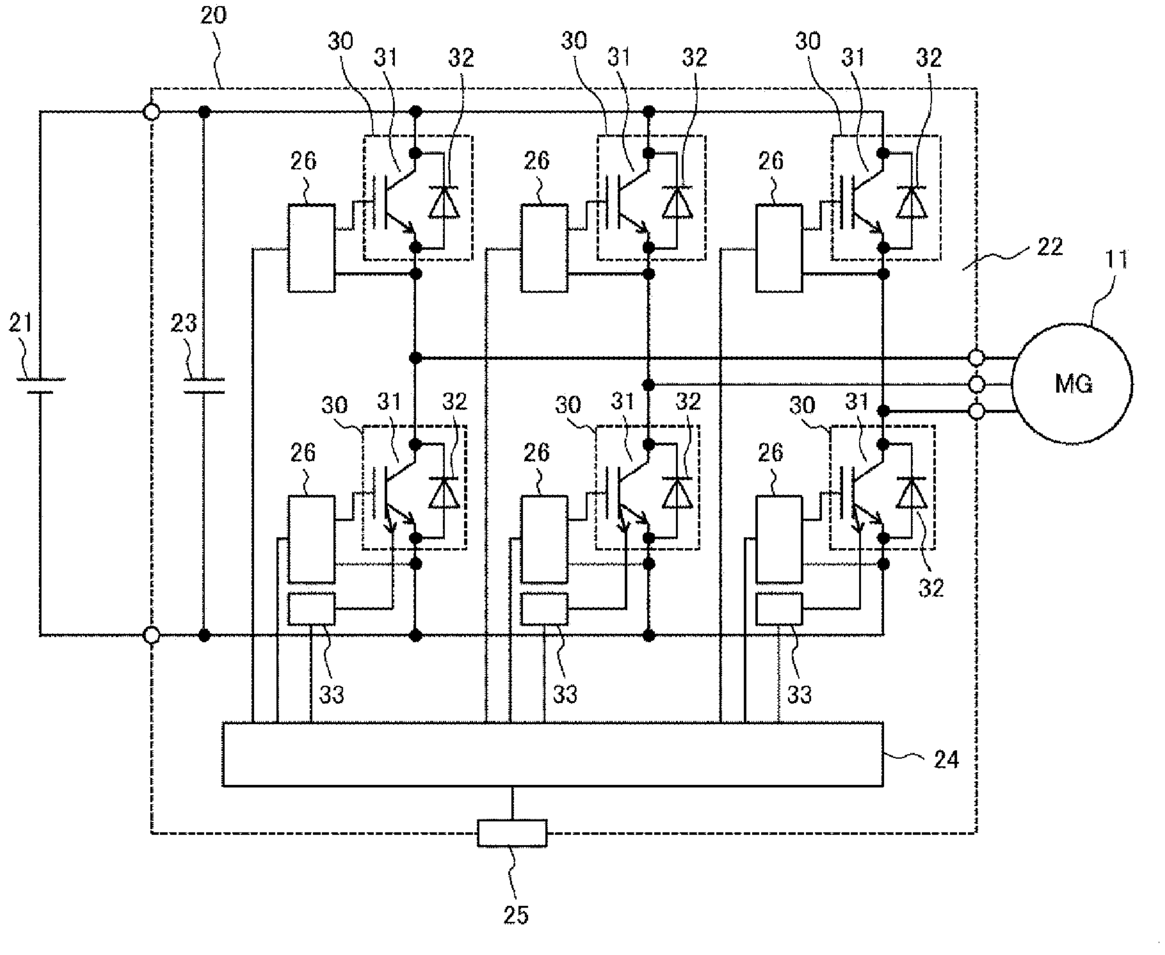
FIG. 13 is a diagram illustrating a single circuit configuration of a power conversion device 20 in the system.

FIG. 13 is a diagram illustrating a single circuit configuration of the power conversion device 20 in the system. In the following description, an example of a power device using a MOSFET will be described. The power conversion device 20 includes upper arms and lower arms including control MOSFETs 31 and diodes 32 constituting power devices 30 corresponding to three phases including a U phase, a V phase, and a W phase of AC power. These three-phase upper and lower arms constitute the inverter circuit 22. Here, the control MOSFET 31 may be written as a "main control element" in relation to a sense element.

The drain terminal of the control MOSFET 31 of the upper arm is electrically connected to the capacitor terminal of the smoothing capacitor 23 on the positive electrode side, and the source terminal of the MOSFET 31 of the lower arm is electrically connected to the capacitor terminal of the smoothing capacitor 23 on negative electrode side. As described above, the control MOSFET 31 has the drain terminal, the source terminal, and the gate terminal. The diode 32 is electrically connected in parallel between the drain terminal and the source terminal.

The gate drive circuit 26 is provided between the source terminal and the gate terminal of the control MOSFET 31 and turns on and off the control MOSFET 31. The inverter control circuit 24 supplies control signals to the plurality of gate drive circuits 26.

The power device 30 of the lower arm is provided with a sense element for current detection arranged in parallel with the control MOSFET 31. This sense element is also constituted by a MOSFET, and a sense current flowing through the source terminal thereof is input to a current detection circuit 33. Then, the rotor speed and the magnetic pole position are calculated based on the current detected by the current detection circuit 33 and the voltage measured separately from the current, and the rotational torque and the rotational speed are controlled using the calculated values.

As described above, the control circuit 24 of the inverter circuit 22 receives a control command from the upper-level control device, generates control signals for controlling the power devices 30 constituting the upper and lower arms of the inverter circuit 22 on the basis of the control command, and supplies the control signals to the gate drive circuits 26. The gate drive circuits 26 supply drive signals for driving the power devices 30 constituting the upper and lower arms of the respective phases to the power devices 30 of the respective phases based on the control signal.

The control MOSFETs 31 of the power devices 30 are turned on or off based on drive signals from the gate drive circuits 26 to convert DC power supplied from the battery 21 into three-phase AC power, and the converted power is supplied to the motor generator 11. A power conversion device having such a configuration is already well known.

A configuration example of the inverter may be an IGBT other than the MOSFET. The same applies even when the semiconductor material is changed to Si, SiC, GaN, gallium oxide, or the like. The present invention can be used not only for hybrid vehicles and electric vehicles but also for general power conversion devices. Further, the configuration example of the electric vehicle can be applied not only to a hybrid vehicle but also to an EV without an internal combustion engine.

The present invention can be applied to, for example, the above-described power conversion device but is not limited thereto and can be widely used.

First Embodiment

Figure 1:
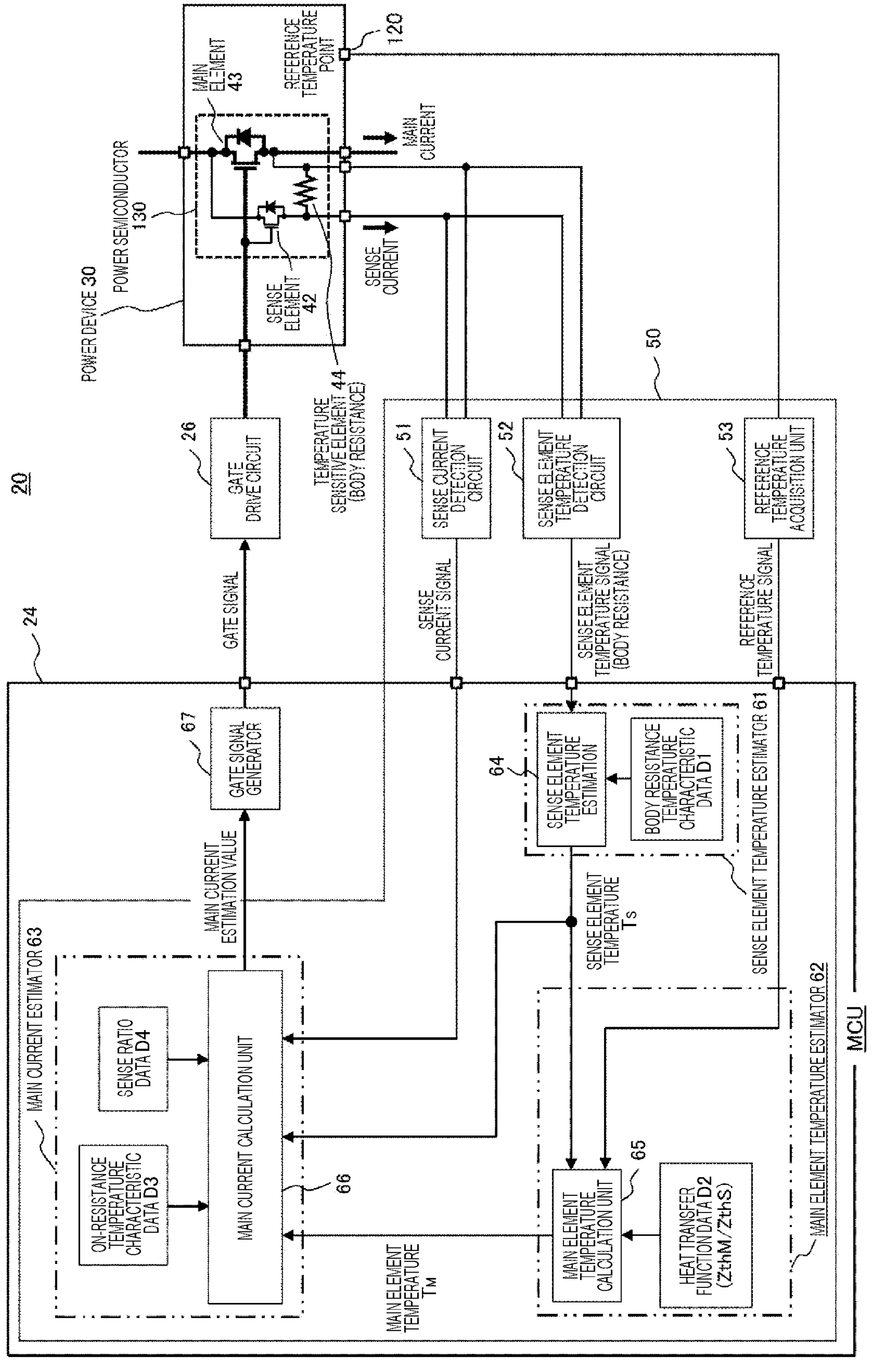
FIG. 1 is a diagram illustrating an overall configuration example of a power conversion device employing a current detection device for a power semiconductor element according to a first embodiment of the present invention.

FIG. 1 is a diagram an overall illustrating configuration example of a power conversion device employing a power semiconductor current detection device according to the first embodiment of the present invention. Referring to FIG. 1, a power conversion device 20 includes a power device 30 and a control circuit 24 (implemented by a microcontroller unit MCU in many cases) that controls the power device 30, and a power semiconductor current detection device 50 is implemented by a combination of a region configured in a hardware manner by an electric circuit and a region configured in a software manner in the MCU. Although not illustrated in FIG. 1, an inverter circuit 22 is configured by electrical connection of a plurality of power devices 30. For example, in the case of a three-phase inverter circuit as illustrated in FIG. 13, one phase of the inverter circuit is configured by series connection of two power devices 30, and the inverter circuit 22 is configured by three-phase parallel connection of one-phase circuits.

Among them, the power device 30 is mainly constituted by a power semiconductor 130 having a main element 43, a sense element 42, and a temperature sensitive element 44 whose body resistance changes depending on the sense element temperature.

In the microcontroller unit (hereinafter referred to as MCU) 24, in addition to the power semiconductor current detection device 50 according to the first embodiment of the present invention, a firing control device of the inverter circuit 22 and the like are housed, but components other than the current detection device 50 are not illustrated in FIG. 1.

The current detection device 50 finally obtains a main current estimation value. For this estimation calculation, the current detection device 50 includes a sense current detection circuit 51 that detects a sense current in the power semiconductor 130, a temperature sense element detection circuit 52 that detects a body resistance corresponding to a sense element temperature by the temperature sensitive element 44, and a reference temperature acquisition unit 53 that obtains a reference temperature for calculating a main temperature from a reference temperature point 120 and is connected to an input unit of the MCU 24.

Furthermore, the current detection device 50 includes, in the MCU 24, a sense element temperature estimator 61 that estimates a sense element temperature $T_S$ from a detected body resistance value (sense element temperature) with reference to body resistance temperature characteristic data D1, a main element temperature estimator 62 that estimates a main element temperature $T_M$ from the sense element temperature $T_S$ and a reference temperature acquired by the reference temperature acquisition unit 53 with reference to heat transfer function data D2 (ZthM/ZthS), and a main current estimator 63 that outputs a main current estimation value from the sense current, the sense element temperature $T_S$, and the main element temperature $T_M$ with reference to on-resistance temperature characteristic data D3, and sense ratio data D4. The MCU 24 gives a gate signal to the gate drive circuit 26 via a gate signal generator 67 that generates a gate signal on the basis of the main current estimation value to perform firing control on the power device 30 and the inverter circuit 22 including the power device 30.

Figure 2:
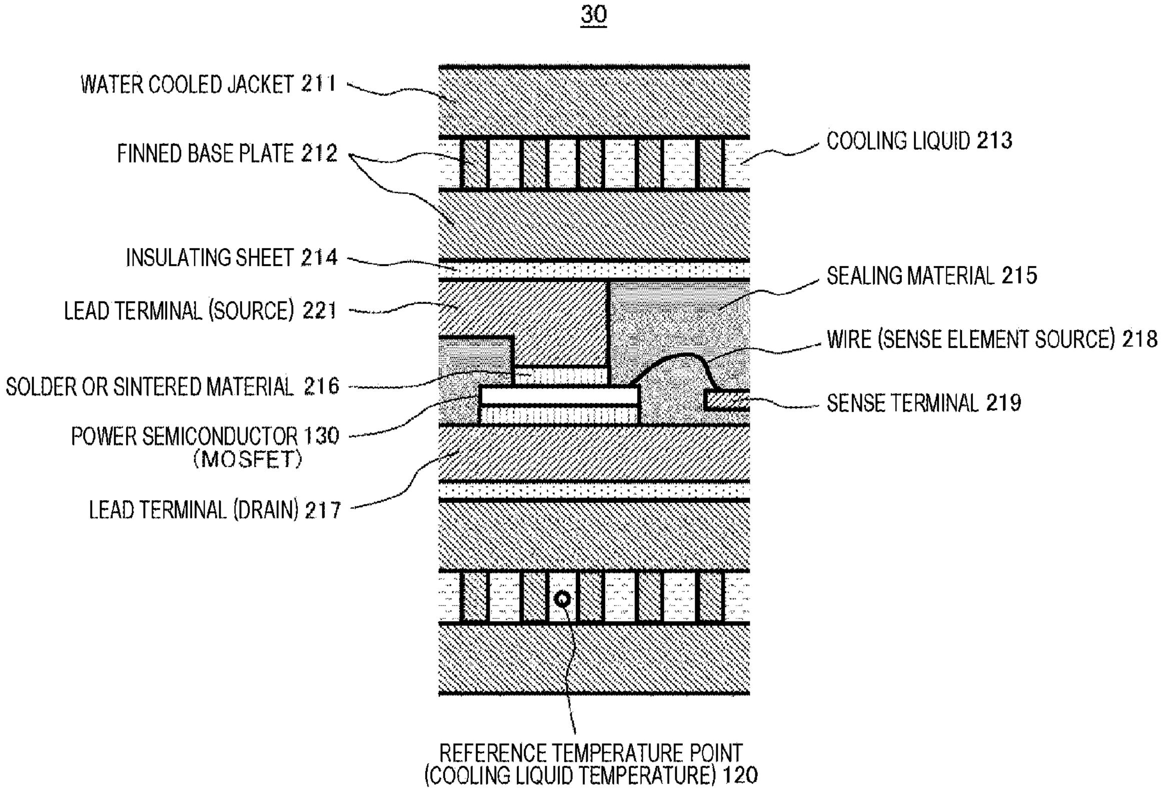
FIG. 2 is a view illustrating an example of a cross-sectional structure of a power device with a double-sided cooling system.

FIG. 2 is a view illustrating an example of a cross-sectional structure of the power device 30 with a double-sided cooling system. Both surfaces (the source electrode and the drain electrode) of the vertical MOSFET which is the power semiconductor 130 are connected to respective lead terminals (a source lead terminal 221 and a drain lead terminal 217) by solder or a sintered material 216.

The lead terminals 221 and 217 are connected to a finned base plate 212 through an insulating sheet 214 and are inserted into a water cooled jacket 211. A cooling liquid 213 is caused to flow through the water passage formed by the base plate 212 and the water cooled jacket 211, so that the heat generated by the power semiconductor 130 is cooled from both sides.

The first embodiment is configured to acquire the temperature of the cooling liquid 213 as a reference temperature. At this time, the position of the reference temperature point 120 is not limited to the position illustrated in FIG. 2. If there is no inflow of heat from a heat source other than the power semiconductor between the power semiconductor 130 and the reference temperature point 120 (or if the influence on the temperature rise of the power semiconductor 130 is negligibly small), the position of the reference temperature point 120 may be any position in the cooling liquid 213. The number of such reference temperature points 120 need not be one, and a reference temperature may be an average temperature within a certain amount region (for example, in the water cooled jacket 211).

An acquisition method may be configured to directly attach a water temperature sensor to the reference temperature point 120 or to indirectly estimate a temperature at the reference temperature point 120 from a value from a water temperature sensor attached to the water cooled jacket 211, a part of the base plate 212, or a water passage outside the water cooled jacket 211 (for example, the inlet/outlet temperature of a radiator).

Note that the range of the MCU 24 according to the present invention is not limited to the configuration of FIG. 1. For example, the sense element temperature estimator 61 and the main element temperature estimator 62 may be configured by circuits different from the MCU 24, or the gate drive circuit 26, the sense current detection circuit 51, the sense element temperature detection circuit 52, and the MCU 24 may be integrated into one integrated circuit. In addition, as described in PTL 2, the sense current detection circuit 51 and the sense temperature detection circuit 52 may be configured by a common circuit, and a detection target may be switched in synchronization with a gate signal. Various combinations are included as an implementation method for each block.

A method of estimating a main current in the above configuration illustrated in FIGS. 1 and 2 will be described in detail.

In the power conversion device 20 in FIG. 1, when the power semiconductor 130 is in an on state, a sense current is detected by the sense current detection circuit 51 and output to the MCU 24. When the power semiconductor 130 is in an off state (that is, when no sense current is flowing), the sense element temperature detection circuit 52 detects a body resistance value and outputs the body resistance value to the MCU 24. The reference temperature acquisition unit 53 outputs the temperature of the cooling liquid 213 at the reference temperature point 120 illustrated in FIG. 2 to the MCU 24.

Upon obtaining these data, in the MCU 24, a sense element temperature estimation unit 64 in the sense element temperature estimator 61 refers to the temperature characteristic data D1 of the body resistance stored in advance in the memory in a table format and estimates the sense element temperature $T_S$ from detected body resistance value.

A main element temperature calculation unit 65 in the main element temperature estimator 62 uses the heat transfer function data D2 (ZthM/ZthS) stored in advance in the memory, the sense element temperature estimation value $T_S$ obtained by the sense element temperature estimator 61, and the reference temperature acquired by the reference temperature acquisition unit 53 to estimate the main element temperature $T_M$ by a calculation method to be described later.

A main current calculation unit 66 in the main current estimator 63 refers to the sense ratio table data D4 and the on-resistance temperature characteristic table data D3 stored in advance in the memory and estimates a main current from the sense current, the sense element temperature $T_S$, and the main element temperature $T_M$.

The gate signal generator 67 outputs a gate signal to the gate drive circuit 26 using a main current estimation value, and the gate drive circuit 26 drives the power semiconductor 130, thereby performing real-time control of the inverter circuit 22.

In the present invention, since the calculation methods of the main element temperature estimator 62 and the main current estimator 63 are novel in the configuration in FIG. 1, the processes in these will be described in detail below.

First, the main element temperature estimator 62 has a role of estimating the average temperature of the main element from the detected sense element temperature $T_S$ and the detected reference temperature. A method of calculating the main element temperature $T_M$ will be described in detail.

Figure 3A:
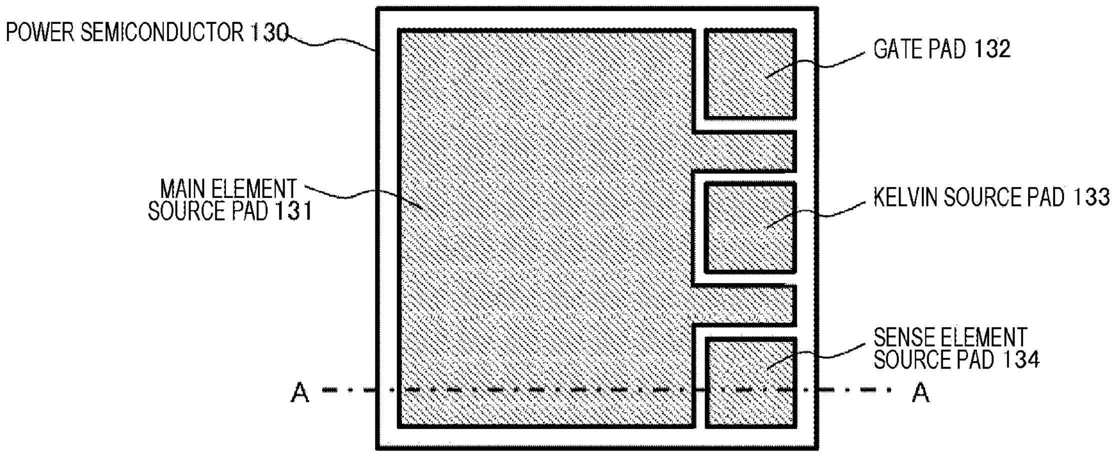
FIG. 3*a* is a view illustrating a planar example of a power semiconductor.
Figure 3B:
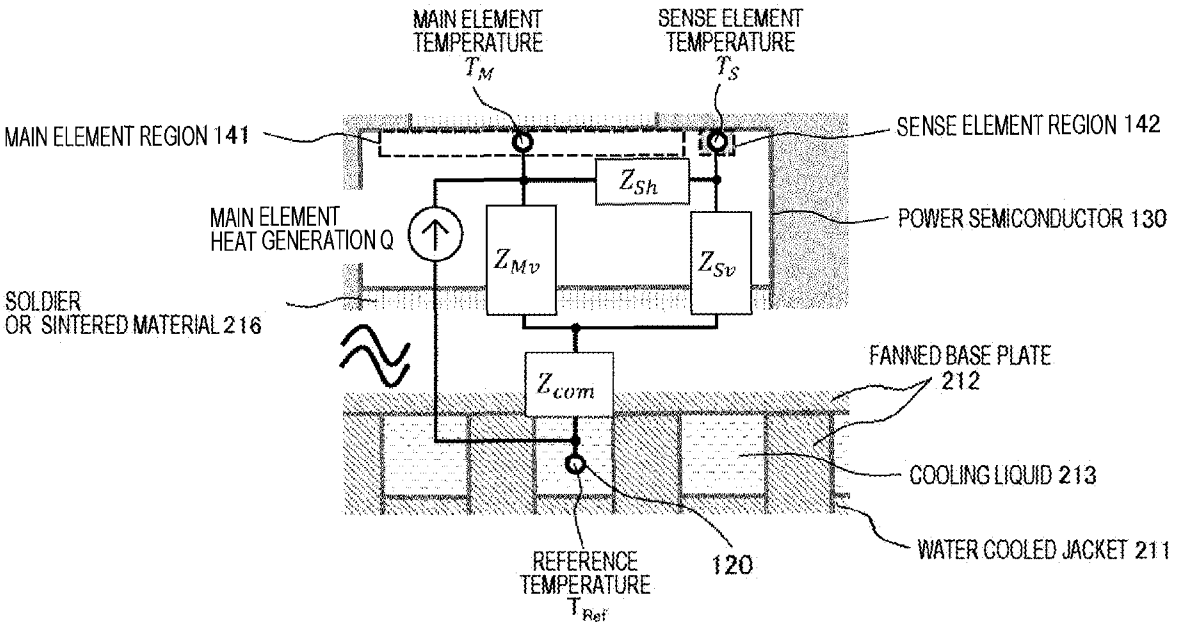
FIG. 3*b* is a diagram showing a cross section of the power device and a thermal equivalent circuit.

FIG. 3*a* is a plan view of a power semiconductor, and FIG. 3*b* illustrates a power device cross section and a thermal equivalent circuit and corresponds to the power device in FIG. 2.

Among them, the main element source pad 131, the gate pad 132, the Kelvin source pad 133, and the sense element source pad 134 are arranged on the plan view of the power semiconductor of FIG. 3*a*, and an A-A cross section including the main element source pad 131 and the sense element source pad 134 in this plane region is illustrated as FIG. 3*b*.

In the power device cross section of FIG. 3*b*, a cross-sectional structure of one side from the power semiconductor 130 to the water cooled jacket 211 in the power device cross section of FIG. 2 is illustrated, and a thermal equivalent circuit of heat transfer from the power semiconductor 130 to the water cooled jacket 211 is illustrated in a simplified manner for ease of description.

In the power semiconductor 130, there are a main element region 141 and a sense element region 142. In this case, the main element temperature $T_M$, which is an average temperature in the main element region 141, is estimated from a reference temperature $T_{Ref}$, which is the temperature of the cooling liquid 213 measured at the reference temperature point 120, and the sense element temperature estimation value $T_S$ in the sense element region 142 obtained by the sense element temperature estimator 61.

This thermal equivalent circuit illustrates a flow of heat when a heat generation Q of the main element of the power semiconductor 130 directly acts on the main element temperature $T_M$ in the main element region 141, the heat generation Q acts on the sense element temperature estimation value $T_S$ in the sense element region 142 via a thermal impedance $Z_{Sh}$, and, on the other hand, the heat generation Q acts on the cooling heat in the cooling liquid 213 via impedances $Z_{com}$, $Z_{Mv}$, and $Z_{Sv}$.

The thermal equivalent circuit will be described in more detail. First, the main element and the sense element are connected to the heat generation Q of the main element by thermal impedance. $Z_{Sh}$ represents a thermal impedance in the planar direction of the power semiconductor between the main element region 141 and the sense element region 142, $Z_{Mv}$ and $Z_{Sv}$ represent thermal impedances of the main element and the sense element in the vertical direction, respectively, and $Z_{com}$ represents a thermal impedance common to the main element and the sense element among the main element and the sense element to the reference temperature point 120.

At this time, the main element temperature $T_M$, the sense element temperature $T_S$, and the reference temperature $T_{Ref}$ are expressed by the relationships represented by expressions (5) and (6).

[Math 5]

$$T_M - T_{Ref} = \{Z_{Mv}(1-R) + Z_{com}\} \cdot Q \tag{5}$$

[Math 6]

$$T_S - T_{Ref} = (Z_{SMv} \cdot R + Z_{com}\} \cdot Q \tag{6}$$

Figure 4:
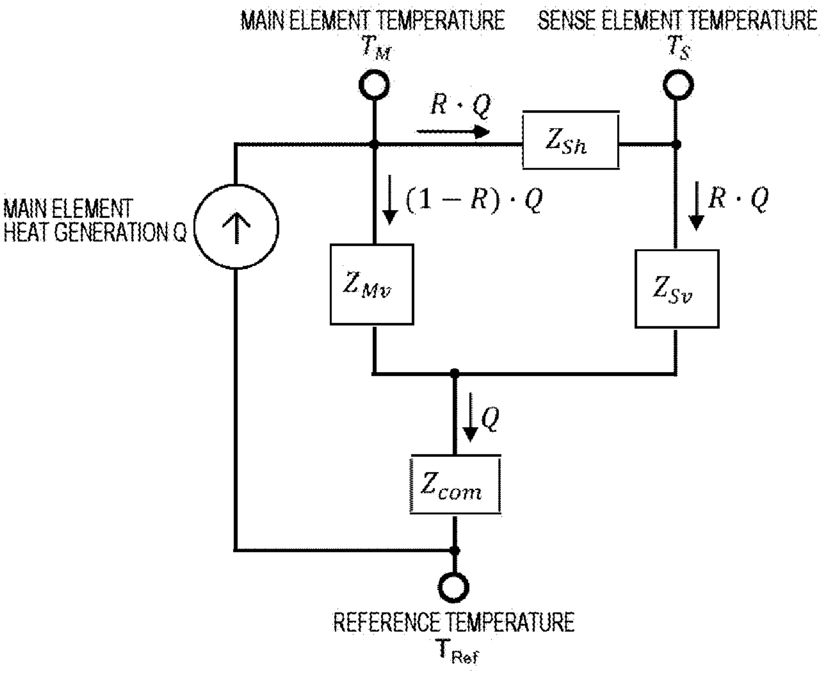
FIG. 4 is a diagram illustrating heat flow directions s additionally written and summarized in the thermal equivalent circuit of FIG. 3*b*.

FIG. 4 is a diagram illustrating heat flow directions additionally written and summarized in the thermal equivalent circuit of FIG. 3*b*. Note that, in FIG. 4 and expressions (5) and (6), R represents a ratio at which the heat generation Q of the main element flows to the sense element. At this time, the terms other than Q on the right sides of expressions (5) and (6) can be regarded as inherent thermal impedances $Z_{M\text{-}Ref}$ and $Z_{S\text{-}Ref}$ determined by the structure of the power device and hence can be rewritten into expressions (7), (8), (9), and (10).

[Math 7]

$$T_M - T_{Ref} = Z_{M-Ref} \cdot Q \tag{7}$$

[Math 8]

$$T_S - T_{Ref} = Z_{S-Ref} \cdot Q \tag{8}$$

[Math 9]

$$Z_{M-Ref} \equiv \frac{T_M - T_{Ref}}{Q} \tag{9}$$

[Math 10]

$$Z_{S-Ref} \equiv \frac{T_S - T_{Ref}}{Q} \tag{10}$$

In these expressions, $Z_{M\text{-}Ref}$ represents a temperature rise due to the heat generation of the main element itself and hence is referred to as a self-thermal impedance, and $Z_{S\text{-}Ref}$ represents a temperature rise of the sense element with respect to the heat generation of the main element and hence is referred to as a mutual thermal impedance.

According to the definitions represented by expressions (9) and (10), $Z_{M\text{-}Ref}$ and $Z_{S\text{-}Ref}$ can be acquired in advance by measuring the relationship between the main element temperature $T_M$, the sense element temperature $T_S$, the reference temperature $T_{Ref}$, and the heat generation Q. In PTL 2, since the term of $T_{Ref}$ is removed by taking the difference between expressions (7) and (8), and $\Delta T = T_M - T_S$ is calculated from a difference $(Z_{M\text{-}Ref})-(Z_{S\text{-}Ref})$ between the heat generation (∝ loss) Q and the thermal impedance represented by expression (1), a problem associated with loss acquisition has occurred.

Therefore, in the present invention, the heat generation Q is removed by taking the ratio between expressions (7) and (8), and the main element temperature $T_M$ is estimated from a thermal impedance ratio $(Z_{M\text{-}Ref})/(Z_{S\text{-}Ref})$, the sense element temperature $T_S$ and the reference temperature $T_{Ref}$ as represented by expression (11). This makes it possible to estimate a main element temperature without any influence by an error associated with loss acquisition.

[Math 11]

$$T_M = \frac{Z_{M-Ref}}{Z_{S-Ref}} \cdot (T_S - T_{Ref}) + T_{Ref} \tag{11}$$

Note that, in consideration of the double-sided cooling structure and the three-dimensional structure, a circuit more complicated than the thermal equivalent circuit diagrams illustrated in FIGS. 3 and 4 is required. If, however, there is no inflow of heat from a heat source other than Q between the main element temperature $T_M$, the sense element temperature $T_S$, and the reference temperature $T_{Ref}$ (alternatively, when the influence on the rise of the main element temperature $T_M$ and the sense element temperature $T_S$ is negligibly small), the circuit can be expressed in the form of expressions (7) to (10). Therefore, the present invention using expression (11) can be applied.

Next, a calculation method of the main current estimator 63 in FIG. 1 will be described. The processing by the main current estimator 63 is similar to the sense ratio correction processing in PTL 1. That is, when the main element temperature and the sense element temperature acquired in advance are equal (temperature difference $\Delta T=0$), the sense ratio data $M_0$ is corrected from the temperature difference during operation, the on-resistance temperature characteristic data acquired in advance, and expressions (2) and (3) to calculate a corrected sense ratio $M_{real}$. A main current estimation value $I_{M-E}$ is output from the sense current and the sense ratio $M_{real}$ using expression (4).

The present invention differs from PTL 1 in that the main element temperature used for calculating the temperature difference $\Delta T$ is calculated not from expression (1) but from expression (11). In executing expression (11), a method of implementing a thermal impedance uses a transfer function in a manner similar to the method described in PTL 2. Since the thermal impedance ratios ($Z_{M-Ref}$) and ($Z_{S-Ref}$) are constituted by a thermal circuit network of thermal resistance and thermal capacity, the thermal impedance ratios ($Z_{M-Ref}$) and ($Z_{S-Ref}$) have a time-delayed response component (that is, a frequency response) with respect to a temporal change Q (t) of a thermal pulse. Since it is necessary to consider the frequency response also when estimating the main element temperature $T_M$, responses $T_M-T_{Ref}$ and $T_M-T_{Ref}$ to the heat pulse width of the temporal change Q (t) of the heat pulse are acquired in advance and converted into heat transfer functions and $Z_{M-Ref}(s)$ $Z_{S-Ref}(s)$ representing frequency responses in the s region.

By storing the thermal impedance ratio $(Z_{M-Ref})/(Z_{S-Ref})$ in the memory as the heat transfer function data D2 in this manner, it is possible to estimate a main current in consideration of such a time-delayed response. As a method of executing the transfer function calculation processing in the MCU 124, a method of implementing the transfer function as a digital filter is well known.

Figure 5A:
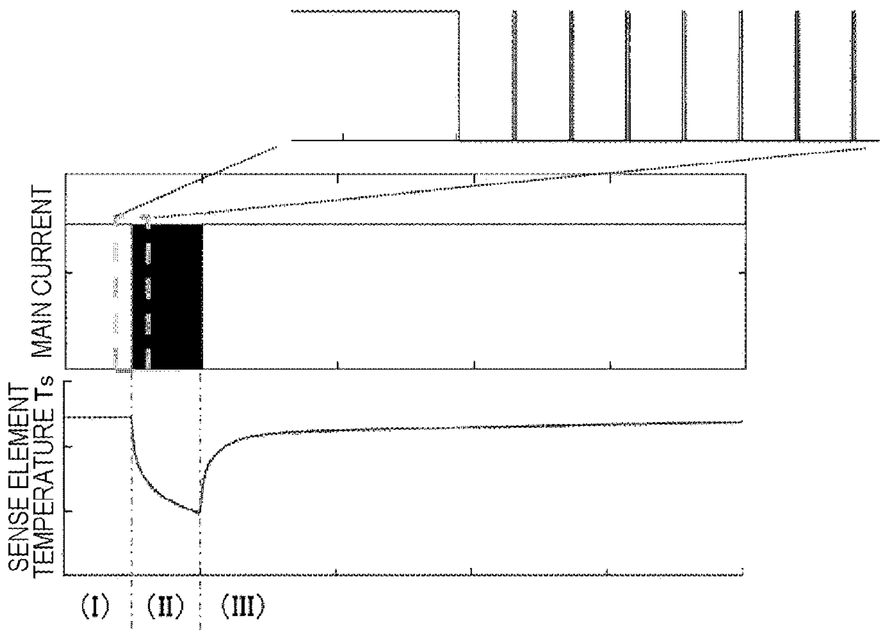
FIG. 5*a* is a graph illustrating the time relationship between a main current and a sense element temperature $T_S$.
Figure 5B:
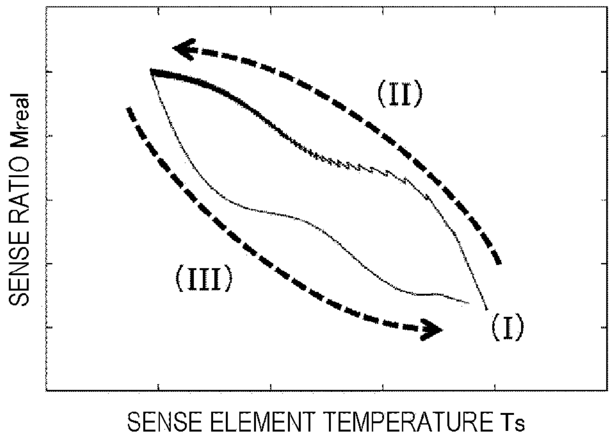
FIG. 5*b* is a graph illustrating a relationship between a sense element temperature $T_S$ and a sense ratio $M_{real}$.

Next is a description of an example of a calculation result indicating hysteresis because the sense ratio $M_{real}$ has a time-delayed response component with respect to the reference temperature. FIG. 5*a* is a graph illustrating the time relationship between a main current and the sense element temperature $T_S$. FIG. 5*a* illustrates a temporal change of the sense element temperature $T_S$ when the main current flowing through the power device is changed from the direct current to the intermittent pulse. FIG. 5*b* is a graph illustrating a relationship between the sense element temperature $T_S$ and the sense ratio $M_{real}$.

According to these, the period (I) in FIG. 5*a* shows a state in which a main current of a constant value continues to flow from the external current source to the power device, and the sense element temperature $T_S$ has reached a steady state, the period (II) shows a state in which a current source is provided as an ON/OFF pulse, and the sense element temperature $T_S$ decreases due to a decrease in the energization period, and the period (III) shows a state in which the main current of the constant value again flows, and the sense element temperature increases.

When there is a temperature change of the power semiconductor due to a change in heat generation as in the periods (II) and (III), the sense ratio $M_{real}$ deviates because the time responses of the main element temperature $T_M$ and the sense element temperature $T_S$ are different. For example, in a case where the time response of the main element temperature $T_M$ is faster than that of the sense element, as illustrated in FIG. 5(*b*), the main element temperature $T_M$ decreases faster during the temperature decrease, so that the on-resistance decreases, and the sense ratio $M_{real}$ increases according to expressions (2) and (3). On the same principle, the sense ratio $M_{real}$ decreases during a temperature rise.

As described above, the sense ratio $M_{real}$ exhibits hysteresis with respect to a change in the sense element temperature $T_S$. Similarly, the sense ratio $M_{real}$ exhibits hysteresis even with respect to a change in the reference temperature. In order to consider such a time-delayed response, it is preferable to estimate the main element temperature $T_M$ using a heat transfer function.

Since the configuration of the first embodiment does not use a loss, a main current can be estimated with high accuracy without being affected by a measurement error at the time of loss acquisition. Furthermore, it is possible to reduce the number of product development steps for loss data acquisition, shorten the development period, and flexibly change the design in accordance with use conditions.

In implementing the present invention, some modifications and alternatives can be adopted. The present embodiment has exemplified the case where the cooling liquid 213 is used as a refrigerant on the premise of the water cooling system, but a cooling system using gas as a refrigerant such as air cooling or a heat pipe may be used.

Figure 6:
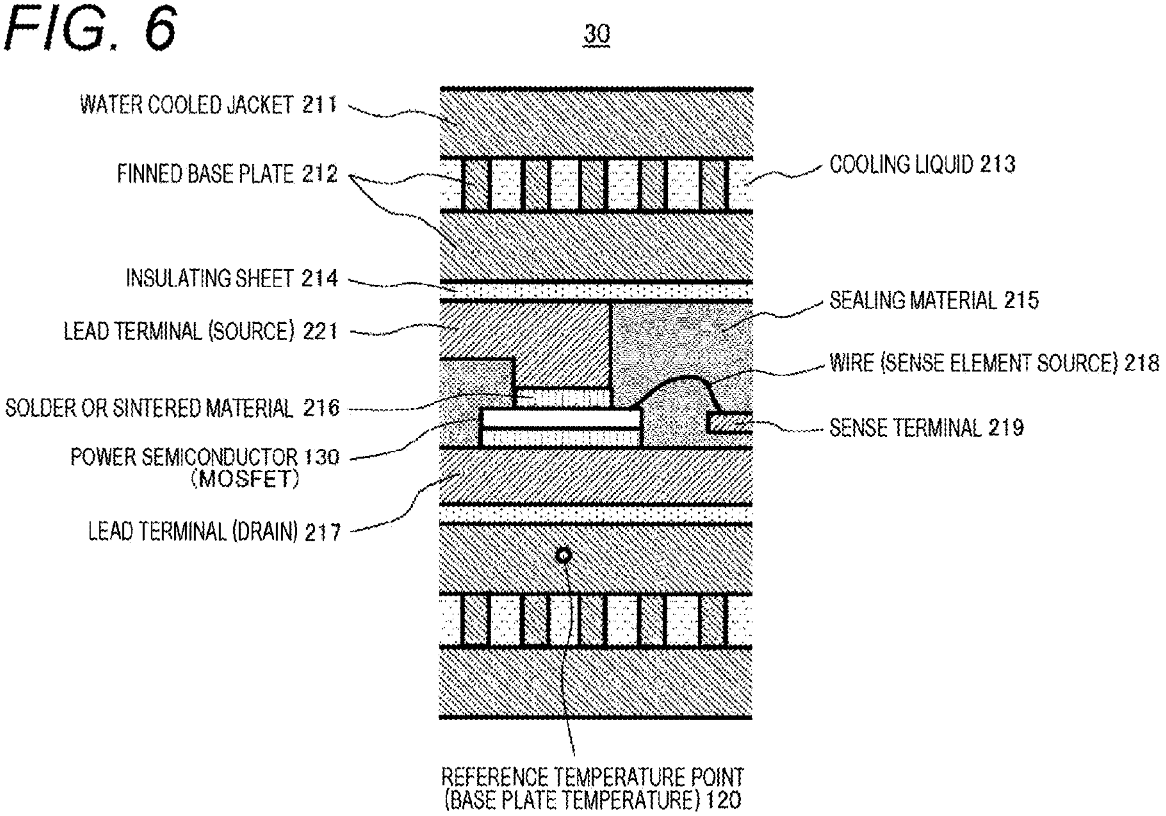
FIG. 6 is a view illustrating an alternative example of a setting position of a reference temperature point 120 and a setting technique.
Figure 7:
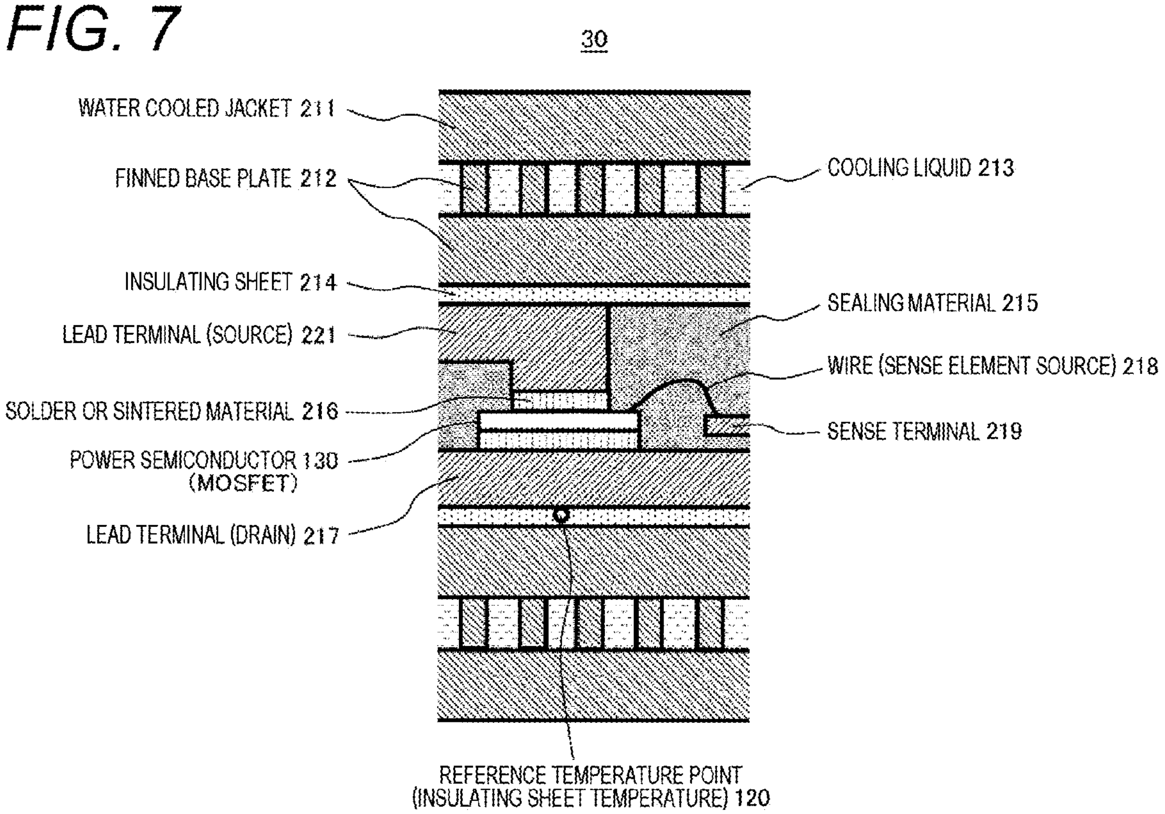
FIG. 7 is a view illustrating an alternative example of the setting position of the reference temperature point 120 and the setting technique.
Figure 8:
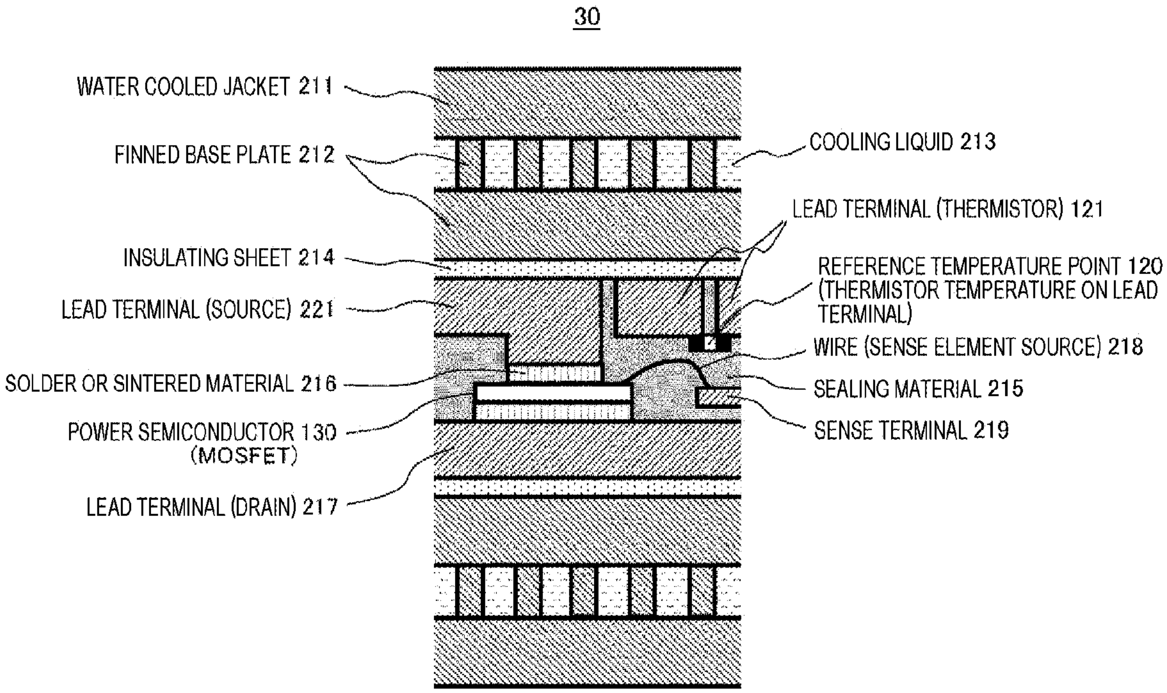
FIG. 8 is a view illustrating an alternative example of the setting position of the reference temperature point 120 and the setting technique.
Figure 9:
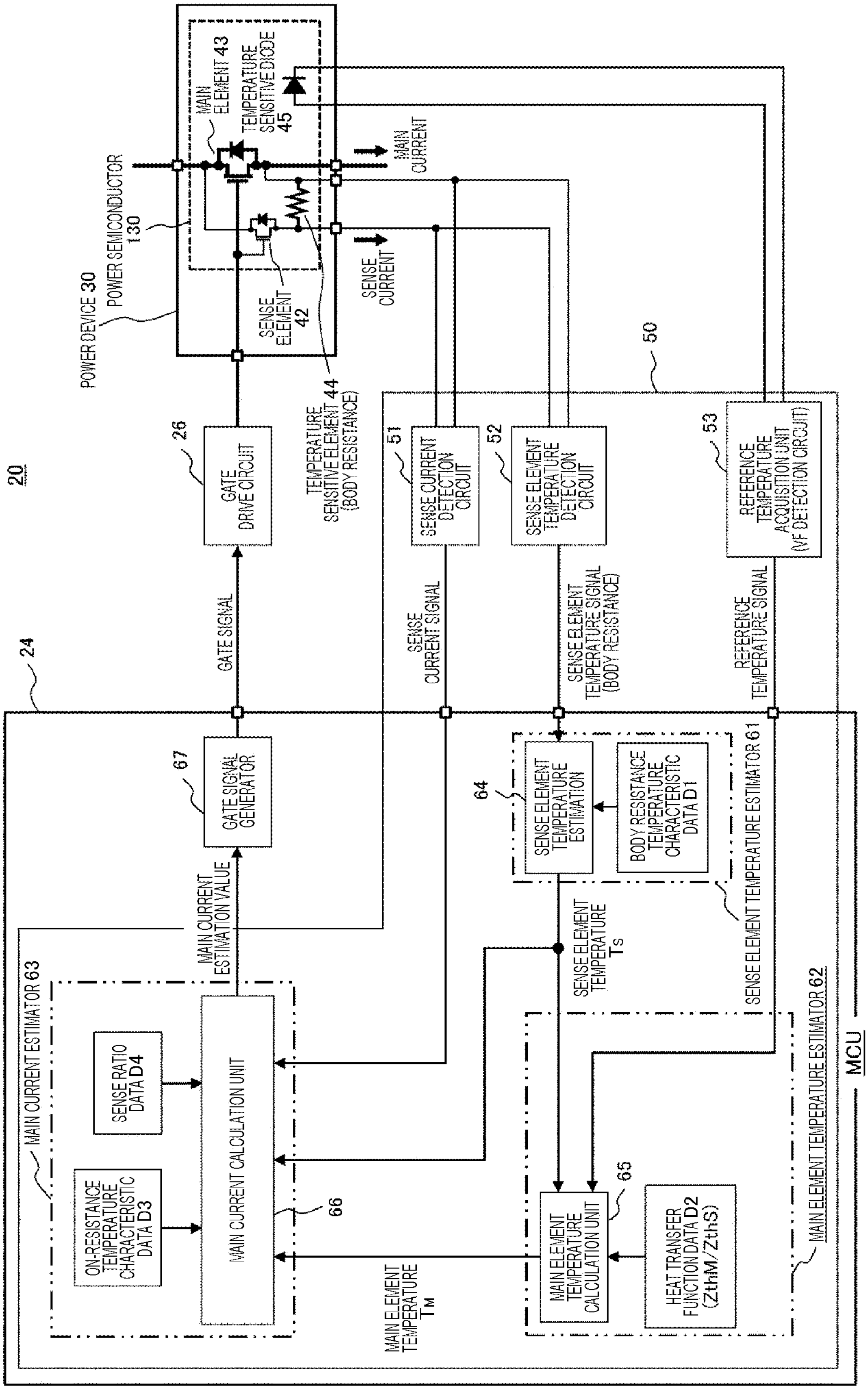
FIG. 9 is a view illustrating an alternative example of the setting position of the reference temperature point 120 and the setting technique.

In addition, the setting position and method of the reference temperature point 120 of the power semiconductor 130 may be a position and a method other than those in FIG. 1. FIG. 6 shows an example in which the temperature of a portion of the base plate 212 is measured by a temperature sensor such as a thermistor or a thermocouple and used as a reference temperature. FIG. 7 shows an example in which the temperature of a portion of the insulating sheet 214 is measured by a temperature sensor such as a thermistor or a thermocouple and used as a reference temperature. FIG. 8 shows an example in which the temperature of a portion of the lead terminal 121 is measured by a temperature sensor such as a thermistor or a thermocouple and used as a reference temperature. FIG. 9 shows an example in which the forward voltage VF of the temperature sensitive diode 45 on the power semiconductor 130 is measured by the VF detection circuit which is the reference temperature acquisition unit 53 and used as a reference temperature.

Second Embodiment

In the first embodiment, a main current is estimated by developing a mathematical formula using the value obtained by the reference temperature acquisition unit 53 as a reference temperature without any change. In contrast to this, the second embodiment is configured to perform processing in consideration of a time-series change in a reference temperature.

In the second embodiment, the sense element temperature and the main element temperature before one sampling period are used as reference temperatures. Expressions (12) and (13) hold, where $T_{M\,(n-1)}$, $Q_{(n-1)}$, and $T_{Ref\,(n-1)}$ represent the main element temperature, the heat generation, and the reference temperature (for example, the cooling liquid temperature) before one sampling period, respectively, $TM_{(n)}$, $Q_{(n)}$, and $T_{Ref(n)}$ represent the main element temperature, the heat generation, and the reference temperature in the current period, respectively, and $Z_{M-Ref}$ represents the thermal impedance of the main element and the reference temperature.

[Math 12]

$$T_{M(n-1)} - T_{Ref(n-1)} = Z_{M-Ref} \cdot Q_{(n-1)} \quad (12)$$

[Math 13]

$$T_{M(n)} - T_{Ref(n)} = Z_{M-Ref} \cdot Q_{(n)} \quad (13)$$

Furthermore, in a case where the reference temperature can be controlled to the constant value $T_{Ref}$ or in a case where a change in the reference temperature is negligibly small, expressions (12) and (13) can be expressed by expressions (14) and (15) given below.

[Math 14]

$$T_{M(n-1)} - T_{Ref} = Z_{M-Ref} \cdot Q_{(n-1)} \quad (14)$$

[Math 15]

$$T_{M(n)} - T_{Ref} = Z_{M-Ref} \cdot Q_{(n)} \quad (15)$$

Removing the reference temperature $T_{Ref}$ by calculating expression (14)-expression (15) will obtain expression (16).

[Math 16]

$$T_{M(n)} - T_{M(n-1)} = Z_{M-Ref} \cdot (Q_{(n)} - Q_{(n-1)}) \quad (16)$$

Expression (17) is similarly established for the sense element.

[Math 17]

$$T_{S(n)} - T_{S(n-1)} = Z_{S-Ref} \cdot (Q_{(n)} - Q_{(n-1)}) \quad (17)$$

Next, removing the heat generation Q by calculating expression (16)/expression (17) can calculate the main element temperature $T_M$ (n) in the current period according to expression (18).

[Math 18]

$$T_{M(n)} = \frac{Z_{M-Ref}}{Z_{S-Ref}} \cdot (T_{S(n)} - T_{S(n-1)}) - T_{M(n-1)} \quad (18)$$

Expression (18) can be regarded as a relational expression for estimating the amount of change in the main element temperature $T_M$ from the amount of change in the sense element temperature using the thermal impedance ratio $(Z_{M-Ref})/(Z_{S-Ref})$. From another point of view, since expression (18) is similar to expression (11) in the first embodiment, it can be regarded as an expression for estimating a main element temperature by setting the sense element temperature and the main element temperature before one sampling period as reference temperatures $T_{Ref1}$ and $T_{Ref2}$.

Since no initial values are determined in expression (18), it is assumed that there is no temperature difference between the main element and the sense element due to self-thermal at the start of an operation, and processing is performed as in expression (19) given below. Here, $T_{S\text{-}initial}$ is a sense element temperature detection value at the start of an operation.

[Math 19]

$$T_{M(1)} = T_{M(0)} = T_{S(1)} = T_{S(0)} = T_{S\_initial} \quad (19)$$

The reference temperature $T_{Ref}$ for measuring the thermal impedance ratio $(Z_{M-Ref})/(Z_{S-Ref})$ may not be the cooling liquid temperature. As in first embodiment, there is no inflow of heat from a heat source other than the heat generation Q of the power semiconductor among $T_M$, $T_S$, and $T_{Ref}$ (that is, expressions (12) and (13) hold). In addition, as a difference from the first embodiment, if the temperature is constant, expression (18) holds, and the method according to the second embodiment can be applied.

Figure 10:
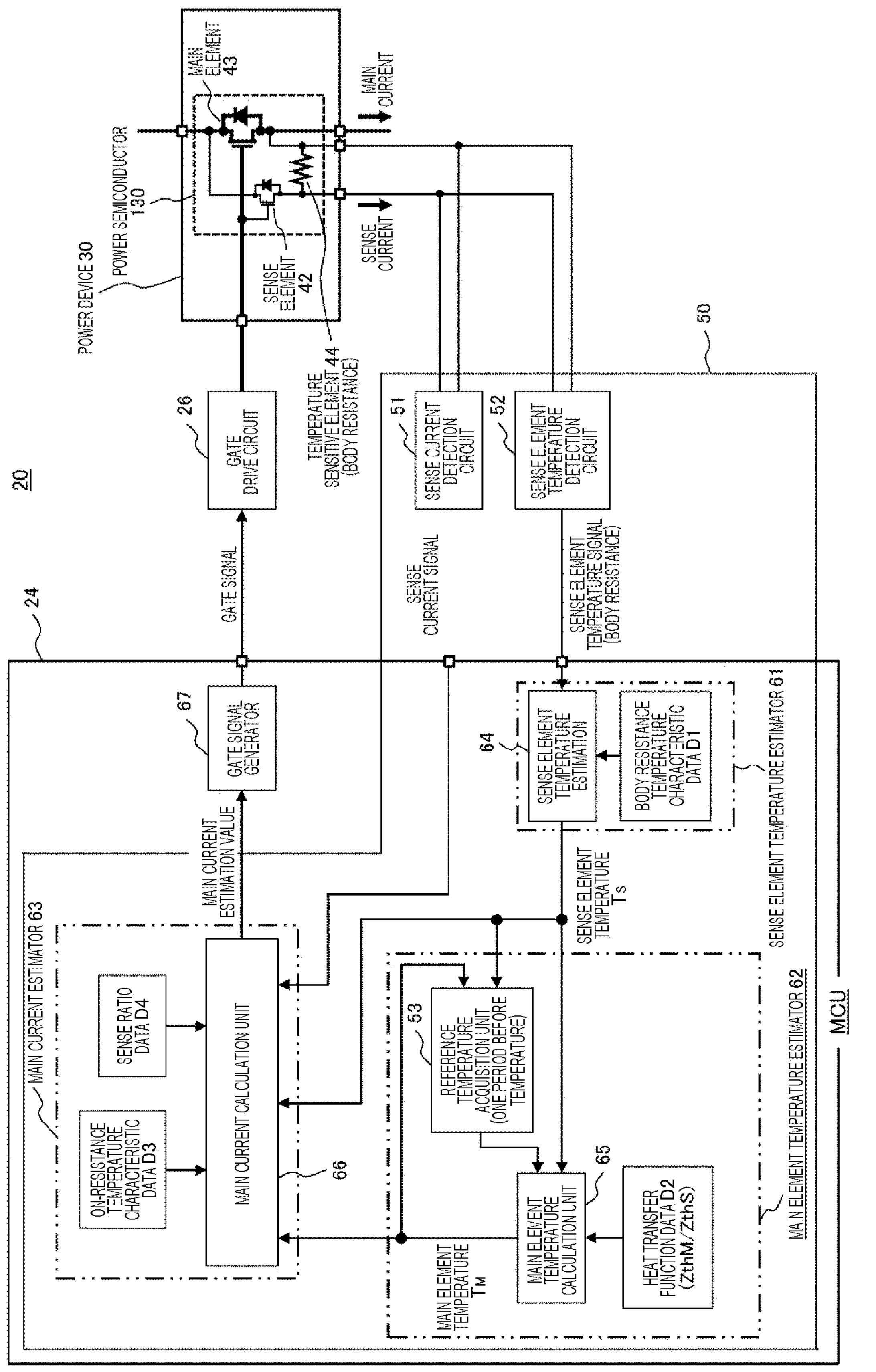
FIG. 10 is a diagram illustrating an overall configuration example of a power conversion device employing a current detection device for a power semiconductor element according to a second embodiment of the present invention.

FIG. 10 illustrates a configuration example of a power conversion device according to the second embodiment of the present invention. FIG. 10 differs from FIG. 1, which is the configuration of the first embodiment, in that a reference temperature acquisition unit 53 acquires a sense element temperature $T_S$ and a main element temperature $T_M$ before one sampling period and stores them in the memory. That is, the sense element temperature $T_S$ and the main element temperature $T_M$ calculated by a sense element temperature estimator 61 and a main element temperature estimator 62 are stored in the memory and used for the calculation of expression (18) in the next sampling period.

With the configuration of the present embodiment, it is possible to achieve an effect of eliminating the need for forming a reference temperature point and a detection circuit for acquiring the reference temperature of the power device as in the first embodiment.

Third Embodiment

In the third embodiment, the temperature of a plurality of power semiconductors connected in parallel are used as a reference temperature.

Figure 11:
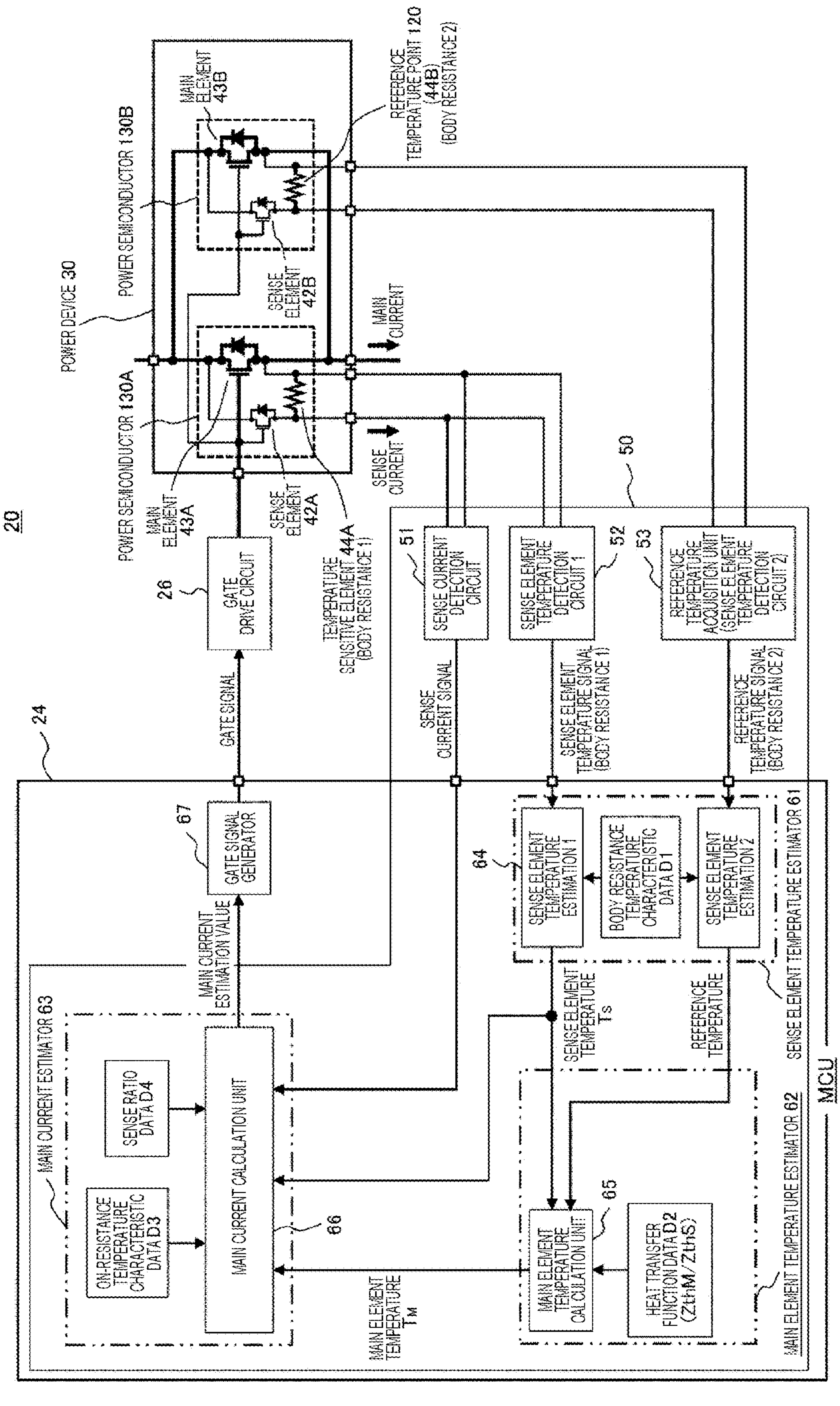
FIG. 11 is a diagram illustrating an overall configuration example of a power conversion device employing a current detection device for a power semiconductor element according to a third embodiment of the present invention.

FIG. 11 illustrates a configuration example of a power conversion device in a case where two power semiconductors 130A and 130B are connected in parallel in a power device 30. A sense element 42A and a temperature sensitive element 44A of the power semiconductor 130A are used to detect a sense current and a sense element temperature in the same manner as in the first embodiment.

On the other hand, a sense element 42B and a temperature sensitive element 44B of the power semiconductor 130B are used to detect a reference temperature by treating a temperature sensitive element 44B as a reference temperature point 120. The reference temperature acquisition unit 53 (the sense element temperature detection circuit 2) detects a body resistance 2 of the sense element and outputs the body resistance 2 to an MCU 24 as a reference temperature signal. A reference temperature is estimated from the detected value of the body resistance 2 with reference to a temperature characteristic table data of body resistances stored in advance in the memory in the sense element temperature estimator of the MCU 24. Other configurations are the same as those of the first embodiment and hence will not be described.

An estimation method of a main element temperature estimator 62 according to the third embodiment will be described. When the main element temperature and the sense element temperature of the power semiconductor 130A are respectively represented by $T_{M1}$ and $T_{S1}$ and the main element temperature and the sense element temperature of the power semiconductor 130B are respectively represented by $T_{M2}$ and $T_{S2}$, the relationships between expressions (20) to (23) hold in the same way as expressions (7) to (10).

[Math 20]

$$T_{M1} - T_{S2} = Z_{M1-S2} \cdot Q \tag{20}$$

[Math 21]

$$T_{S1} - T_{S2} = Z_{S1-S2} \cdot Q \tag{21}$$

[Math 22]

$$Z_{M1-S2} \equiv \frac{T_{M1} - T_{S2}}{Q} \tag{22}$$

[Math 23]

$$Z_{S1-S2} \equiv \frac{T_{S1} - T_{S2}}{Q} \tag{23}$$

Here, Q represents the total amount of heat generation of the parallel chips. $Z_{M1-S2}$ and $Z_{S1-S2}$ represent thermal impedances determined by the structure of the power device and can be measured in advance from the relationship between expressions (22) and (23). When Q is removed from expressions (20)/(21), the relationship of expression (24) is obtained.

[Math 24]

$$T_{M1} = \frac{Z_{M1-S2}}{Z_{S1-S2}} \cdot (T_{S1} - T_{S2}) + T_{S2} \tag{24}$$

Therefore, by regarding $T_{S2}$ as a reference temperature $T_{Ref}$, the same form as expression (11) in the first embodiment is obtained, and a main element temperature 1($T_{M1}$) can be calculated from the reference temperature.

In addition, it is also possible to calculate a main element temperature 2($T_{M2}$) from expression (25) with the sense element temperature 1($T_{S1}$) regarded as a reference temperature by switching the roles of the temperatures of the power semiconductor 130A and the power semiconductor 130B.

[Math 25]

$$T_{M2} = \frac{Z_{M2-S1}}{Z_{S2-S1}} \cdot (T_{S2} - T_{S1}) + T_{S1} \tag{25}$$

As the main element temperature estimation value output by the main element temperature estimator, any one of $T_{M1}$ and $T_{M2}$ or an average value of $T_{M1}$ and $T_{M2}$ may be calculated and output.

Although FIG. 11 illustrates the example of the two-chip parallel connection, the present embodiment can also be applied to a case where three or more chips may be connected in parallel. For example, the N−1 chips among the N chips connected parallel may be regarded as the power semiconductor 130A in FIG. 11, and the remaining one chip may be regarded as the power semiconductor 130B.

REFERENCE SIGNS LIST

22 inverter circuit
24 control circuit, microcontroller unit
26 gate drive circuit
30 power device
42 sense element
43 main element
44 temperature sensitive element
50 current detection device
51 current detection circuit
52 sense element temperature detection circuit
53 reference temperature acquisition unit
61 sense element temperature estimator
62 main element temperature estimator
63 main current estimator
67 gate signal generator
130 power semiconductor
120 reference temperature point

The invention claimed is:

1. A current detection device for a power device on which a power semiconductor including a main element, a sense element for current detection, and a temperature sensitive element for temperature detection is mounted, the current detection device by comprising:

a sense current detection circuit to output a sense current value detected by the sense element;

a sense element temperature detection circuit to output a signal corresponding to temperature of the sense element;

a reference temperature acquisition circuit to acquire a reference temperature of the power device; and a microcontroller to:

determine a temperature of the main element (i) based on the temperature of the sense element and the reference temperature, and (ii) using a thermal impedance ratio representing a ratio between a mutual thermal impedance of the sense element and a self-thermal impedance of the main element with respect to heat generation of the main element;

determine a main current value flowing through the main element based on the sense current value, the temperature of the sense element, and the temperature of the main element; and control operation of the power semiconductor using the main current value a temperature of the main element.

2. The current detection device of claim 1, wherein the microcontroller is to: determine the temperature of the main element based on a product of a temperature difference between the temperature of the sense element and the reference temperature and the thermal impedance ratio.

3. The current detection device of claim 2, wherein the reference temperature acquisition circuit acquires a temperature of a refrigerant for cooling the power device as the reference temperature.

4. The current detection device of claim 2, wherein the reference temperature acquisition circuit acquires a temperature of a thermistor mounted on the power device as the reference temperature.

5. The current detection device of claim 2, wherein the reference temperature acquisition circuit acquires a temperature of a base plate of the power device as the reference temperature.

6. The current detection device of claim 2, wherein the reference temperature acquisition circuit acquires a temperature of an insulator of the power device as the reference temperature.

7. The current detection device of claim 2, wherein the reference temperature acquisition circuit acquires a temperature of a terminal of the power device as the reference temperature.

8. The current detection device of claim 2, wherein the reference temperature acquisition circuit acquires the sense element temperature of the sense element and the temperature of the main element before one sampling period or more as the reference temperature.

9. The current detection device of claim 2, wherein the sense element temperature detection circuit acquires temperatures of temperature sensitive elements of some of a plurality of power semiconductors connected in parallel in the power device, and the reference temperature acquisition circuit acquires, as the reference temperature, temperatures of temperature sensitive elements of a remainder of the plurality of power semiconductors connected in parallel in the power device.

10. A power conversion device comprising a power device on which a power semiconductor including a main element, a sense element for current detection, and a temperature sensitive element for temperature detection is mounted and a control circuit that drives a gate of the power device, wherein the control circuit generates a gate signal of the power device according to a main current estimation value estimated by the current detection device for a power device defined in claim 1 and drives the gate of the power device.

* * * * *